United States Patent
Lin et al.

(10) Patent No.: US 7,525,467 B2
(45) Date of Patent: Apr. 28, 2009

(54) SYSTEM FOR DISPLAYING IMAGE AND DIGITAL-TO-ANALOG CONVERTING METHOD

(75) Inventors: Wei-Cheng Lin, Hsinchu (TW); Kai-Chieh Yang, Kaohsiung (TW); Keiichi Sano, Taipei (TW); Fang-Hsing Wang, Taichung (TW); Ting-Yu Chang, Kaohsiung (TW)

(73) Assignee: TPO Displays Corp., Miao-Li Country (TW)

( * ) Notice: Subject to any disclaimer, the term of this patent is extended or adjusted under 35 U.S.C. 154(b) by 0 days.

(21) Appl. No.: 12/031,736

(22) Filed: Feb. 15, 2008

(65) Prior Publication Data

US 2008/0198054 A1    Aug. 21, 2008

(30) Foreign Application Priority Data

Feb. 16, 2007    (TW) .............................. 96106081 A

(51) Int. Cl.
*H03M 1/66*    (2006.01)
(52) U.S. Cl. ...................................... 341/144; 341/150
(58) Field of Classification Search ................ 341/139, 341/172, 144, 150; 330/253, 292; 327/91
See application file for complete search history.

(56) References Cited

U.S. PATENT DOCUMENTS

| | | | | |
|---|---|---|---|---|
| 6,166,671 | A * | 12/2000 | Kitagawa et al. | 341/139 |
| 6,369,729 | B1 * | 4/2002 | Srinivasan et al. | 341/143 |
| 6,667,707 | B2 * | 12/2003 | Mueck et al. | 341/172 |
| 2009/0002357 | A1 * | 1/2009 | John et al. | 345/212 |

* cited by examiner

*Primary Examiner*—Peguy JeanPierre
(74) *Attorney, Agent, or Firm*—Thomas, Kayden, Horstemeyer & Risley

(57) ABSTRACT

A digital to analog converter is provided comprising a charge sharing circuit, a discharging circuit and a voltage boosting circuit. The charge sharing circuit sequentially receives first to (N−1)th bits of serial digital signals. The charge sharing circuit shares and stores charges between a first capacitor and a second capacitor according to a charging voltage, a ground voltage, a first clock signal and serial data signals. The discharging circuit discharges the charge sharing circuit according to a reset signal. After the voltage boosting circuit receive the (N−1)th digital signal, the charge boosting circuit whether to boost a first terminal and a second terminal of the second capacitor or not based on an Nth digital signal. After the voltage boosting circuit receives the Nth serial digital signal, the charge sharing circuit outputs an analog signal from the second terminal of the second capacitor.

20 Claims, 6 Drawing Sheets

SYSTEM FOR DISPLAYING IMAGE AND DIGITAL-TO-ANALOG CONVERTING METHOD

BACKGROUND OF THE INVENTION

1. Field of the Invention

The invention relates to a D/A converting circuit, and in particular relates to a low powered D/A converting circuit.

2. Description of the Related Art

FIG. 1 is a conventional four-bit resisting digital to analog converter (D/A converter) 100. The four-bit resisting D/A converter 100 comprises sixteen serial resistors (R1~R16) and sixty four (4*16) switch transistors. The serial resistors are coupled between a reference voltage Vref and a ground voltage GND. As shown in FIG. 1, the four-bit resisting D/A converter 100 uses serial resistors (R1~R16) to generate sixteen different voltages and controls turning on or off of switch transistors according to digital data (D1, D2, D3 and D4) to output different output voltages corresponding to digital data (D1, D2, D3 and D4) to output terminal 101. Though the four-bit resisting D/A converter 100 can rapidly generate different output voltages corresponding to digital data (D1, D2, D3 and D4) by using the voltage dividing method. However, resistors and switch transistor are required more for higher resolution. For example, if the converter is an eight-bit converter, the converter needs 512 serial resistors and 2048 switch transistors. The required circuit layout size is much larger than the four-bit converter. Thus, the resisting D/A converter is not suitable for high-resolution D/A converter application. In addition, a lot of power consumption is required by the resisting D/A converter.

Recently, with display panel trends of higher resolution, lower power and smaller size display panels, reduction of power consumption and circuit layout size have become more and more important.

BRIEF SUMMARY OF THE INVENTION

A detailed description is given in the following embodiments with reference to the accompanying drawings.

An embodiment of a digital to analog converter is provided. The digital to analog converter comprises a charge sharing circuit and a voltage boosting circuit. The charge sharing circuit receives first to (N-1)th bits of serial digital signals by sequence and shares and stores charges in a first capacitor and a second capacitor by sequence according to a reference voltage, a ground voltage, a first clock signal and the first to (N-1)th bits of serial digital signals. The voltage boosting circuit determines whether to boost a first terminal and a second terminal of the second capacitor to the reference voltage according to a second clock signal and an Nth bit of the serial digital signal after receiving the (N-1)th bit of the serial digital signal. The charge sharing circuit outputs an analog signal from the second terminal of the second capacitor after the voltage boosting circuit receives the Nth bit of the serial digital signal.

Another embodiment of a digital to analog converting method is provided. The method comprises: (a) sharing and storing charges in a first capacitance and a second capacitance by sequence according to a reference voltage, a ground voltage, a first clock and first to (N-1)th bits of serial digital signals; (b) deciding whether to boost a first terminal and a second terminal of the second capacitance to the reference voltage according to a second clock signal and the Nth bit of the serial digital signal; and (c) outputting an analog signal from the second terminal of the second capacitance after a voltage boosting circuit receives the Nth bit of the serial digital signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
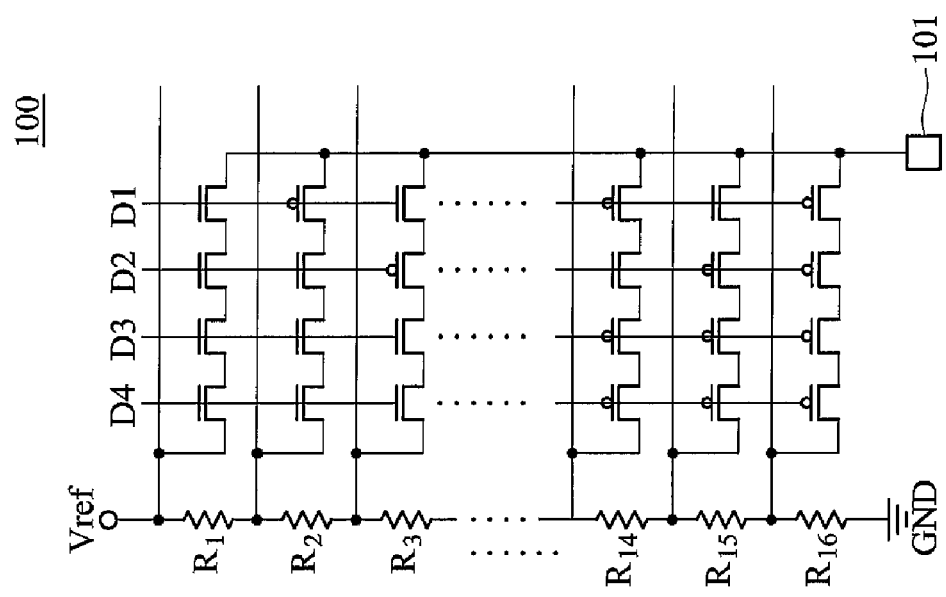
FIG. 1 is a conventional four-bit resisting digital to analog converter (D/A converter)
Figure 2:
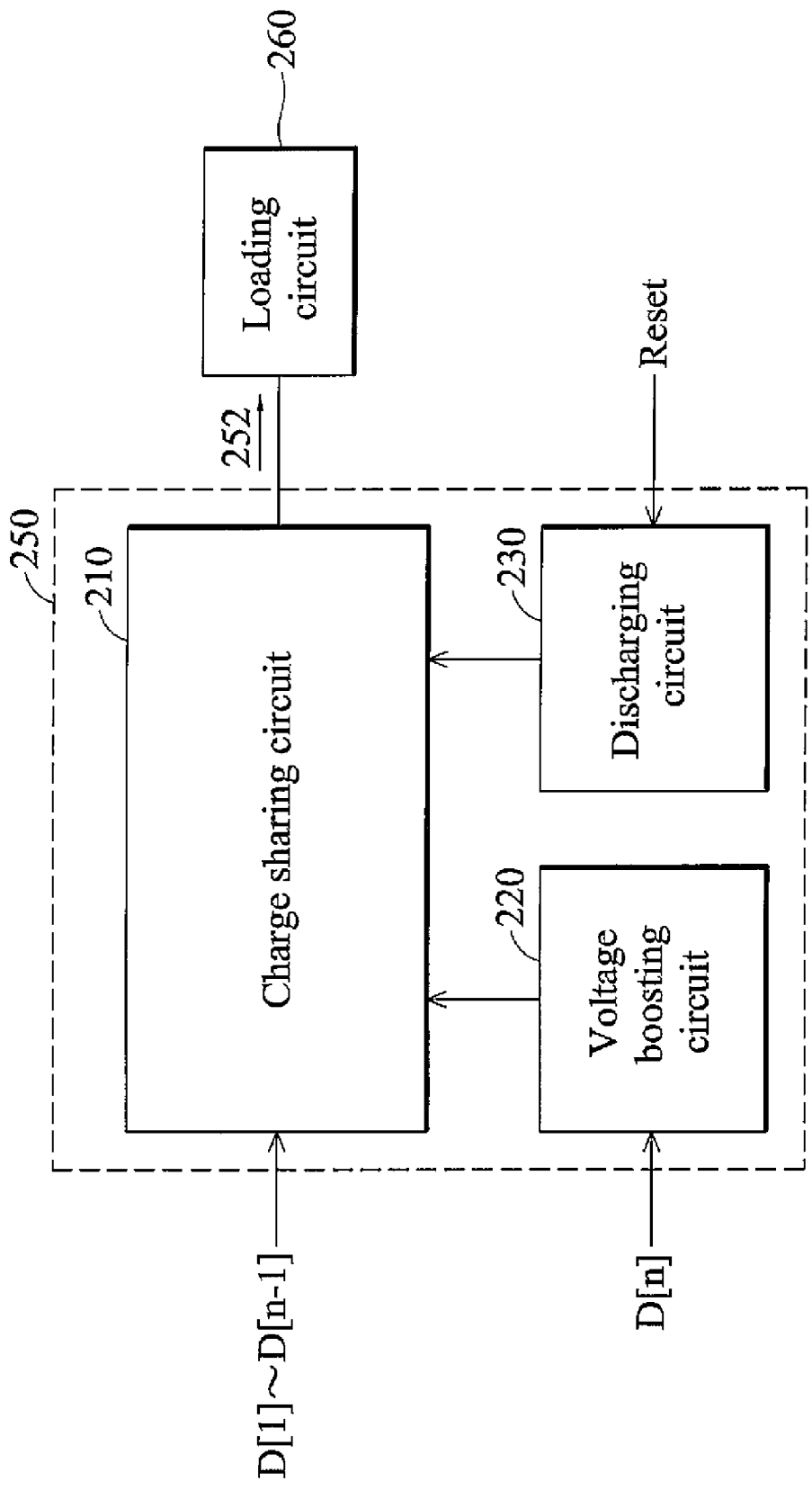
FIG. 2 is a schematic block diagram of a digital to analog converter (D/A converter) according to an embodiment of the invention.

FIG. 2 is a schematic block diagram of a digital to analog converter (D/A converter) 250 according to an embodiment of the invention. The D/A converter 250 comprises a charge sharing circuit 210, a voltage boosting circuit 220 and a discharging circuit 230. The charge sharing circuit 210 receives serial digital signals D[1]~D[n−1] by sequence. Then, the voltage boosting circuit 220 receives the serial digital signal D[n]. The D/A converter 250 outputs analog signals 252 to a loading circuit 260 according to the serial digital signal D[1:n]. Meanwhile, the discharging circuit 230 discharges the charge sharing circuit 210 according to a reset signal Reset. More detailed discussion of circuitry and operation of the D/A converter 250 are presented as following.

Figure 3:
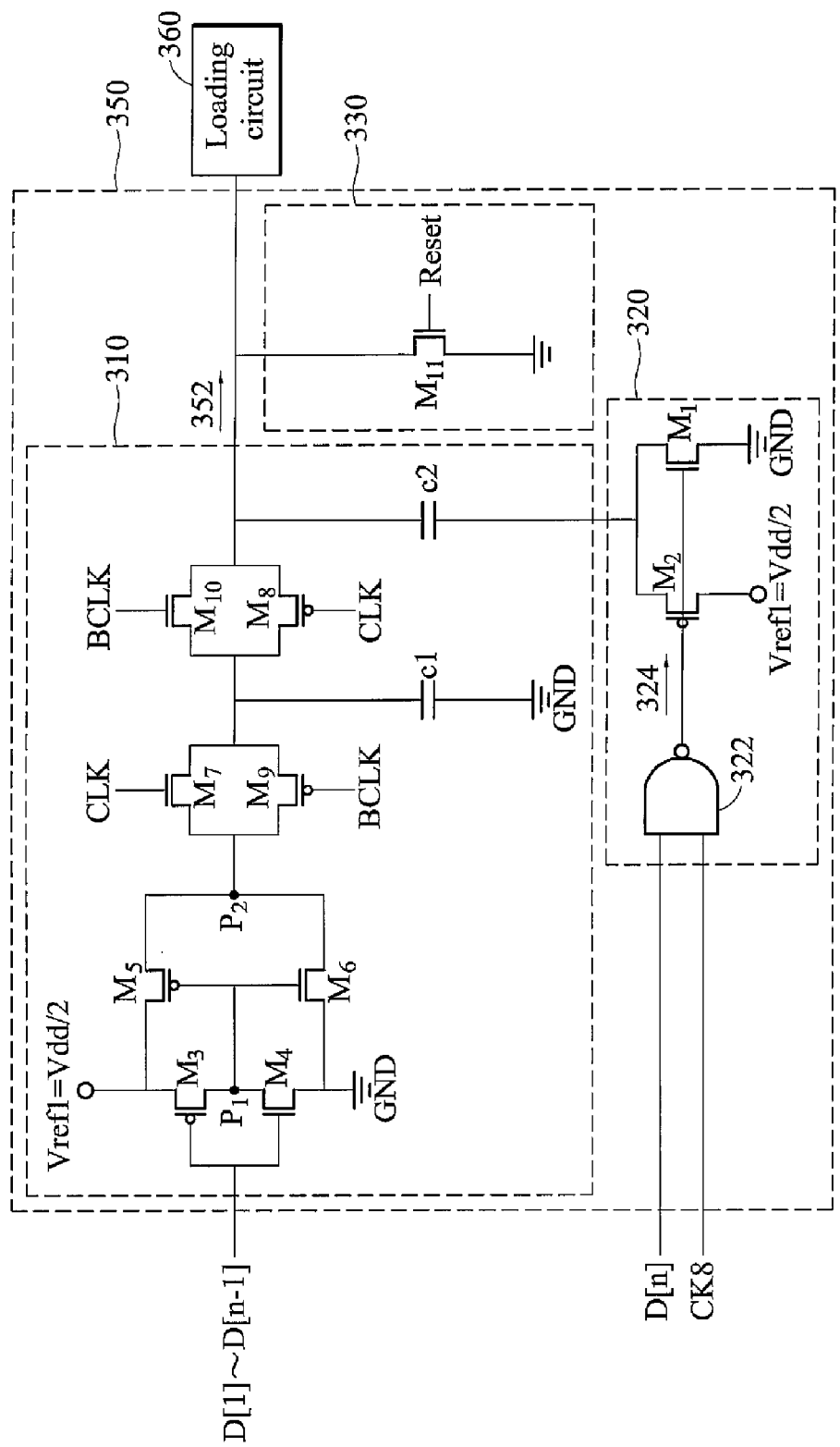
FIG. 3 is a schematic block diagram of a digital to analog converter (D/A converter) according to another embodiment of the invention.

FIG. 3 is a schematic block diagram of a digital to analog converter (D/A converter) 350 according to another embodiment of the invention. The D/A converter 350 comprises a charge sharing circuit 310, a voltage boosting circuit 320 and a discharging circuit 330. The charge sharing circuit 310 can comprise a third switch M3, fourth switch M4, fifth switch M5, sixth switch M6, seventh switch M7, eighth switch M8, ninth switch M9, tenth switch M10, first capacitor C1 and second capacitor C2. The third switch M3 is coupled between a reference voltage Vref1 and a node P1. The third M3 receives the serial digital signals D[1]~D[n−1] by sequence and is turned on or off according to the digital signals D[1]~D[n−1]. The fourth switch M4 is coupled between a ground voltage GND and a node P1. The third M4 also receives the serial digital signals D[1]~D[n−1] by sequence and is turned on or off according to the digital signals D[1]~D[n−1]. When the third switch M3 is turned, the fourth switch M4 is turned off. When the fourth switch M4 is turned on, the third switch M3 is turned off. The fifth switch M5 is coupled between the reference voltage Vref1 and a node P2 and turned on or off according to the voltage level of the node P1. The sixth switch M6 is coupled between the ground voltage GND and the node P2 and turned on or off according to the voltage level of the node P1. When the fifth switch M5 is turned on, the sixth switch M6 is turned off and vice versa. The seventh switch M7 and the ninth switch M9 are coupled between the node P2 and the first capacitor C1 and turned on or off respectively according to clock signals CLK and BCLK. The eighth switch M8 and the tenth switch M10 are coupled between the first capacitor C1 and the second capacitor C2 and turned on or off respectively according to clock signals BCLK and CLK. When the seventh switch M7 and the ninth switch M9 are turned on, the eighth switch M8 and the tenth switch M10 are turned off. When the seventh switch M7 and the ninth switch M9 are turned off, the eighth switch M8 and the tenth switch M10 are turned on. The first capacitor C1 is coupled between the seventh switch M7 and ground voltage GND. The second capacitor C2 is coupled between the voltage boosting circuit 320 and a loading circuit 360. The first bit of the serial digital signals D[1] is the least significant bit (LSB) and the Nth bit of the serial digital signals D[n] is the Most significant bit (MSB).

The voltage boosting circuit 320 can comprise a NAND gate 322, first switch M1 and second switch M2. The NAND gate 322 generates a control signal 324 according to the serial digital signal D[n] and a clock signal CK8. The first switch M1 is coupled between the second capacitor C2 and the ground voltage GND. When the charge sharing circuit 310 receives the serial digital signal D[1]~D[n−1], the first switch M1 is turned on according to the control signal 324 and the second capacitor C2 directly connects to the ground voltage GND. The second switch M2 is coupled between the second capacitor C2 and the reference voltage Vref1. When the D/A converter 350 receives the serial digital signal D[n], the second switch M2 directs the second capacitor C2 to connect to the reference voltage Vref1 or the ground voltage GND according to the control signal 324.

The charge discharging circuit 330 can be an eleventh switch M11 coupled between the ground voltage GND and the loading circuit 360. After the D/A converter 350 receives the serial digital signals D[1]~D[n] and the charge sharing circuit 310 outputs an analog signal 352, the eleventh switch M11 discharges the first capacitor C1 and the second capacitor C2 according to the reset signal Reset.

According to an embodiment of the invention, the charge storing sizes of the first capacitor C1 and the second capacitors C2 can be the same. The second, third, fifth, eighth, ninth switches can be PMOS transistors and the first, fourth, sixth, seventh and tenth switches can be NMOS transistors. When the serial digital signals D[1]~D[n−1] are at a low voltage level, the third switch M3 is turned on and the fourth switch M4 is turned off. The node P1 is at the reference voltage Vref1. The fifth switch M5 is turned off and the sixth switch M6 is turned on. Thus, the node P2 is at the ground voltage GND. When the serial digital signals D[1]~D[n−1] are at a high voltage level, the third switch M3 is off and the fourth switch M4 is turned on. The node P1 is at the ground voltage GND. The fifth switch M5 is turned on and the sixth switch M6 is turned off. Thus, the node P2 is at the reference voltage Vref1.

Since the clock signals CLK and BCLK are opposite to each other, the seventh switch M7 and the ninth switch M9 are turned on or off simultaneously and the eighth switch M8 and the tenth switch M10 are turned on or off simultaneously. Further, the seventh switch M7 and the tenth switch M10 are not turned on simultaneously and the eighth switch M8 and the ninth switch M9 are also not turned on simultaneously. When the seventh switch M7 and ninth switch M9 are turned on, the first capacitor C1 charges or discharges according to the voltage level of the node P2. When the fifth switch M5 is turned on, the first capacitor C1 charges. When the sixth switch M6 is turned on, the first capacitor discharges. When the eighth switch M8 and the tenth switch M10 are turned on (the seventh switch M7 and the ninth switch M10 are turned off), the second capacitor C2 and the first capacitor C1 share charges to determine the cross voltages of the second capacitor C2 and the first capacitor C1. According to another embodiment of the invention, the charge sharing circuit 310 is not composed of the ninth transistor M9 and the tenth transistor M10.

When the D/A converter 350 receives the serial digital signals D[1]~D[n−1], the control signal 324 is at a high voltage level. The first switch M1 is turned on and the second capacitor C2 is coupled between the ground voltage GND and the loading circuit 360. When the D/A converter 350 receives the serial digital signal D[n], the control signal 324 is at a high or low voltage level according to the clock signal CK8 and the serial digital signal D[n]. According to another embodiment of the invention, when the serial digital signal D[n] is zero, the control signal 324 is at a high voltage level. The first switch M1 is turned on and the second capacitor C2 is coupled between the ground voltage GND and the loading circuit 360. When the serial digital signal D[n] is one, the control signal 324 is at a low voltage level. The second switch M2 is turned on and the second capacitor C2 is coupled between the reference voltage Vref1 and the loading circuit 360. Thus, both terminals of the second capacitor C2 are simultaneously boosted to the reference voltage Vref1.

As shown in FIG. 3, assuming the serial digital signal D[n] is an eight-bit serial digital signal, the voltage Vout of the analog signal 352 is $$Vout = \cfrac{\cfrac{\cfrac{\cfrac{\cfrac{\cfrac{\cfrac{D[1]}{(2)}}{2} + \cfrac{D[2]}{2}}{2} + \cfrac{D[3]}{2}}{2} + \cfrac{D[4]}{2}}{2} + \cfrac{D[5]}{2}}{2} + \cfrac{D[6]}{2}}{2} + \cfrac{D[7]}{2}}{2} + \cfrac{D[8]}{2}$$

Since the reference voltage Vref1 is half of the power voltage Vdd (Vref1=Vdd/2), the D/A converter 350 uses the reference voltage Vref1, not the power voltage Vdd. Thus, the D/A converter 350 consumes less power.

Figure 4:
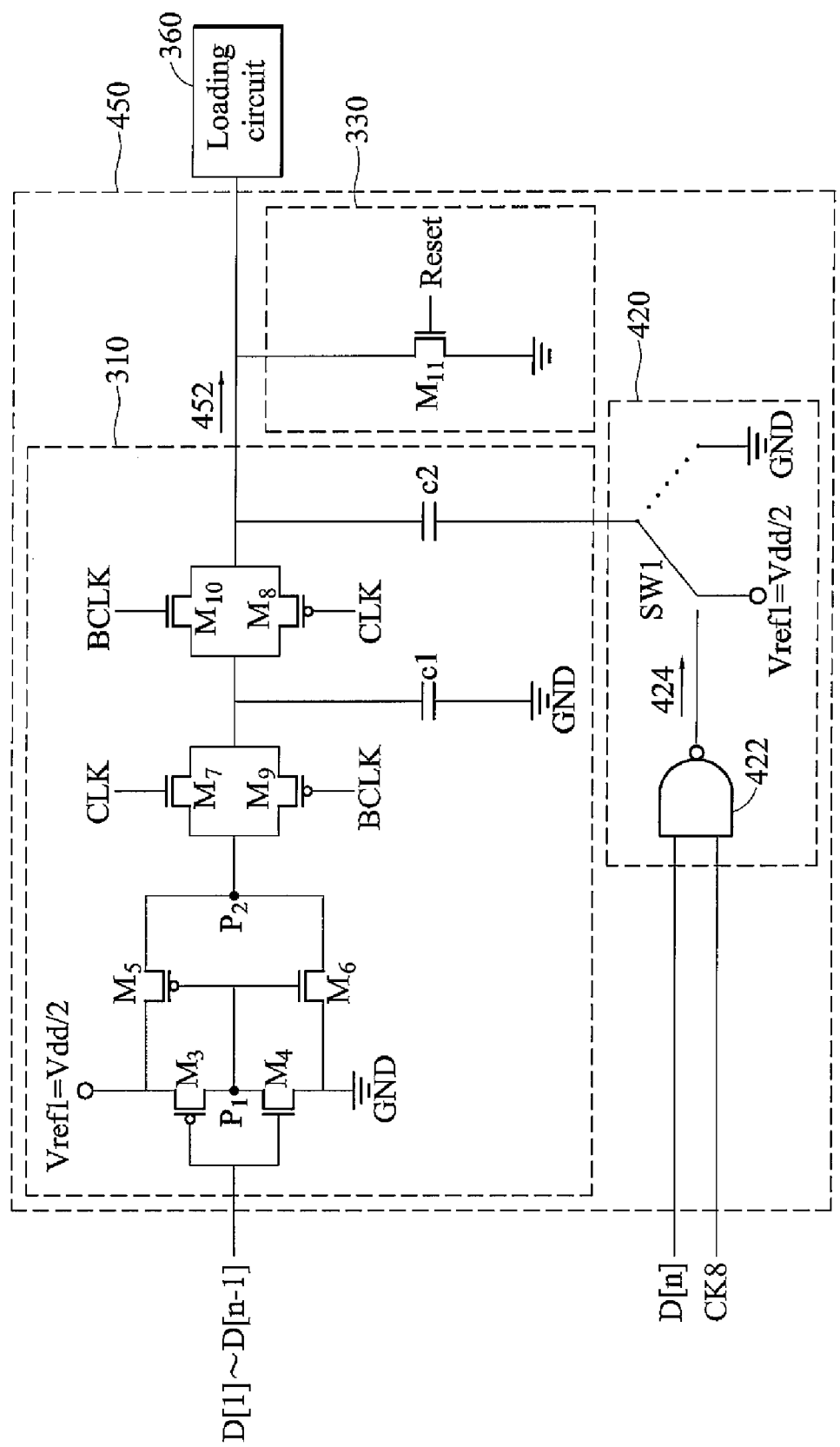
FIG. 4 is a digital to analog converter (D/A converter) according to another embodiment of the invention.

FIG. 4 is a digital to analog converter (D/A converter) 450 according to another embodiment of the invention. The D/A converter 450 is similar to the D/A converter 350. The difference is the voltage boosting circuit. The voltage boosting circuit 420 can comprise a NAND gate 422 and a switch SW1. The NAND gate 422 generates a control signal 424 according to the Nth bit of the serial digital signals D[n] and the clock signal CK8. The switch SW1 is coupled between the second capacitor C2 and the reference voltage Vref1 or the ground voltage GND. When the charge sharing circuit 310 receives the serial digital signals D[1]~D[n−1], the first terminal of the second capacitor C2 is coupled to the ground voltage GND. When the D/A converter 450 receives the Nth bit of the serial digital signal D[n], the second capacitor C2 is coupled to the reference voltage Vref1 or the ground voltage GND according to the control signal 424. Since other operations of the D/A converter 450 are the same as those of the D/A converter 350, detailed descriptions are not described again.

Figure 5:
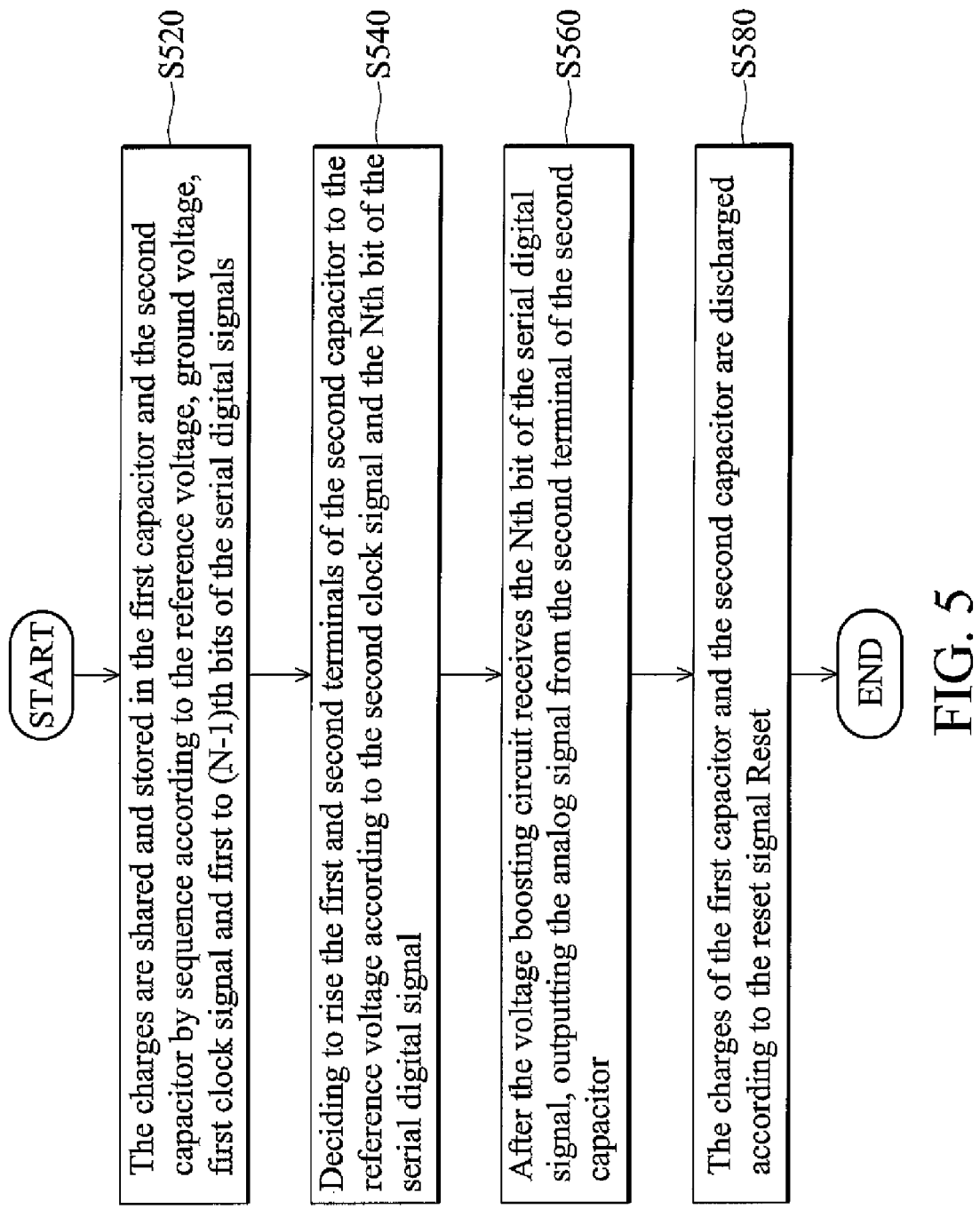
FIG. 5 is a flow chart of digital signals converting to analog signals according to another embodiment of the invention.

FIG. 5 is a flow chart of digital signals converting to analog signals according to another embodiment of the invention. In step 520, the first to (N−1)th bits of the serial digital signals are received. The charges are shared and stored in the first capacitor C1 and the second capacitor C2 of the charge sharing circuit 310 by sequence according to the reference voltage Vref1, ground voltage GND, first clock signal CLK and first to (N−1)th bits of the serial digital signals D[1]~D[n−1]. In step 540, the Nth bit of the serial digital signal D[n] is received, and then it is decided whether to boost the first terminal and the second terminal of the second capacitor C2 to the reference voltage Vref1 according to the second clock signal CLK8 and the Nth bit of the serial digital signal D[n]. After the voltage boosting circuit 320 receives the Nth bit of the serial digital signal D[n], the analog signal 352 is outputted from the second terminal of the second capacitor C2 (Step S560). The charges of the first capacitor C1 and the second capacitor C2 are discharged according to the reset signal Reset (step S580).

Figure 6:
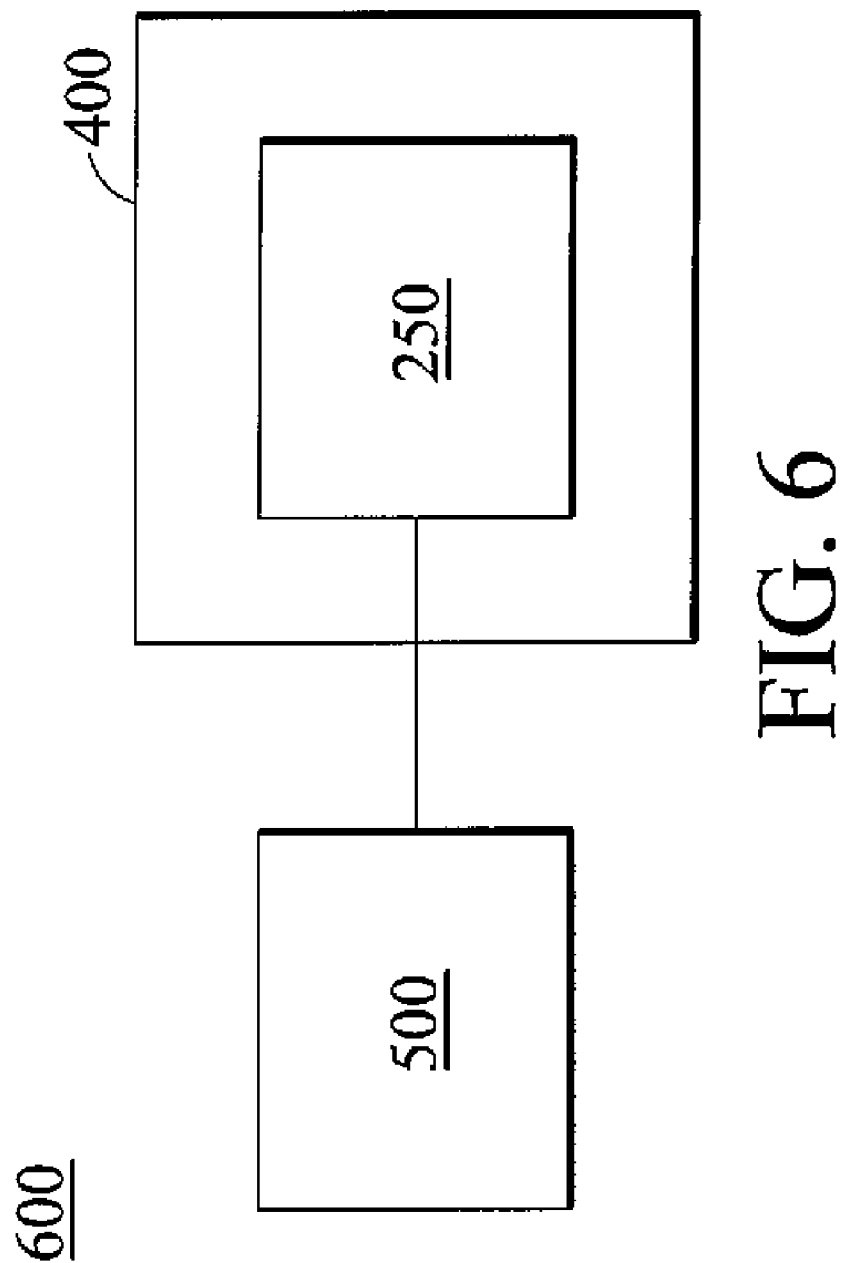
FIG. 6 schematically shows another embodiment of a system for displaying images.

FIG. 6 schematically shows another embodiment of a system for displaying images which, in this case, is implemented as a display panel 400 or an electronic device 600. As shown in FIG. 6, display panel 400 comprises the D/A converter 250 of FIG. 2. The display panel 400 can form a portion of a variety of electronic devices (in this case, electronic device 600). Generally, an electronic device 600 can comprise a display panel 400 and a power supply 500. Further, the power supply 500 is operatively coupled to the display panel 400 and provides power to the display panel 400. The electronic device 600 can be a mobile phone, digital camera, PDA (personal data assistant), notebook computer, desktop computer, television, or portable DVD player, for example.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image display system, having a digital to analog converter comprising:
    a charge sharing circuit receiving first to (N−1)th bits of serial digital signals by sequence and sharing and storing charges in a first capacitor and a second capacitor by sequence according to a reference voltage, a ground voltage, a first clock signal and the first to (N−1)th bits of serial digital signals; and
    a voltage boosting circuit determining whether to boost a first terminal and a second terminal of the second capacitor to the reference voltage according to a second clock signal and an Nth bit of the serial digital signal after receiving the (N−1)th bit of the serial digital signal,
    wherein the charge sharing circuit outputs an analog signal from the second terminal of the second capacitor after the voltage boosting circuit receives the Nth bit of the serial digital signal.

2. The image display system as claimed in claim 1, further comprising a discharging circuit discharging the charge sharing circuit according to a reset signal.

3. The image display system as claimed in claim 2, wherein the discharge circuit comprises an eleventh switch and the eleventh switch discharges the charges of the first capacitance and the second capacitance according to the reset signal after the charge sharing circuit outputs the analog signal.

4. The image display system as claimed in claim 1, wherein when the charge sharing circuit receives the first to (N−1)th bits of the serial digital signals, the voltage boosting circuit connects the first terminal of the second capacitor to the ground and the voltage boosting circuit determines whether the first terminal of the second capacitor connects to the reference voltage or the ground voltage according to the Nth bit of the serial digital signal and the second clock signal after the charge sharing circuit receives the (N−1)th bit of the serial digital signal.

5. The image display system as claimed in claim 1, wherein the first bit of the serial digital signal is a least significant bit (LSB) and the Nth bit of the serial digital signal is a most significant bit (MSB).

6. The image display system as claimed in claim 1, wherein the reference voltage is a half of a system power voltage.

7. The image display system as claimed in claim 1, wherein the voltage boosting circuit comprises:
    a NAND gate outputting a control signal according to the Nth bit of the serial digital signal and the second clock signal; and
    a switch coupled to the second capacitor and coupled to the reference voltage or the ground voltage,
    wherein when the charge sharing circuit receives the first to (N−1)th bits of the serial digital signals, the first terminal of the second capacitor is coupled to the ground voltage and when the voltage boosting circuit receives the Nth bit of the serial digital signal, the first terminal of the second capacitor is coupled to the reference voltage or the ground voltage according to the control signal.

8. The image display system as claimed in claim 1, wherein the voltage boosting circuit comprises:
    a NAND gate outputting a control signal according to the Nth bit of the serial digital signal and the second clock signal;
    a first switch coupled between the second capacitor and the ground voltage, wherein when the charge sharing circuit receives the first to (N−1)th bits of the serial digital signals, the first switch is turned on to cause the first terminal of the second capacitor to couple to the ground voltage according to the control signal; and
    a second switch coupled between the second capacitor and the reference voltage, wherein when the voltage boosting circuit receives the Nth bit of the serial digital signal, the second switch is turned on to cause the first terminal of the second capacitor to couple to the reference voltage according to the control signal.

9. The image display system as claimed in claim 8, wherein the first switch is an NMOS transistor and the second switch is a PMOS transistor and wherein when the charge sharing circuit receives the first to (N−1)th bits of the serial digital signals, the control signal is at a high voltage level to turn on the first switch.

10. The image display system as claimed in claim 8, wherein the first switch is an NMOS transistor and the second switch is a PMOS transistor and wherein when the Nth bit of the serial digital signal is at a high voltage level, the control signal is at a low voltage level to turn on the second switch.

11. The image display system as claimed in claim 1, wherein when the first clock signal is at a high voltage level, the first capacitor of the charge sharing circuit stores charges according to the first to (N−1)th bits of the serial digital signals and wherein when the first clock signal is at a low voltage level, the charges are averagely stored in the first capacitor and the second capacitor.

12. The image display system as claimed in claim 1, wherein the charge sharing circuit comprises:
- a third switch coupled between the reference voltage and a first node and turned on according to the first to (N−1)th bits of the serial digital signals;
- a fourth switch coupled between the ground voltage and the first node and turned on according to the first to (N−1)th bits of the serial digital signals, wherein when the third switch is turned on, the fourth switch is turned off and when the third switch is turned off, the fourth switch is turned on;
- a fifth switch coupled between the reference voltage and a second node and turned on according to voltage level of the first node;
- a sixth switch coupled between the ground voltage and the second node and turned on according to the voltage of the first node, wherein when the fifth switch is turned on, the sixth switch is turned off and when the fifth switch is turned off, the sixth turned on;
- a seventh switch coupled between the second node and the first capacitance and turned on according to the first clock signal;
- a eighth switch coupled between the first capacitance and the second capacitance and turned on according to the first clock signal, wherein when the seventh switch is turned on, the eighth switch is turned off and when the seventh switch is turned off, the eighth switch is turned on;
- a ninth switch coupled between the second node and the first capacitance and turned on according to a third clock signal;
- a tenth switch coupled between the first capacitance and the second capacitance and turned on according to the third clock signal, wherein when the ninth switch is turned on, the tenth switch is turned off and when the ninth switch is turned off, the tenth switch is turned on;
- the first capacitance coupled to the ground voltage; and
- the second capacitance coupled to the voltage boosting circuit.

13. The image display system as claimed in claim 12, wherein when the first clock signal is at a high voltage level and the third clock signal is at a low voltage level, the first capacitance of the charge sharing circuit stores the charges according to the first to (N−1)th bits of the serial digital signals and when the first clock signal is at a low voltage level and the third clock signal is at a high voltage level, the charges are averagely stored in the first capacitance and the second capacitance.

14. The image display system as claimed in claim 12, wherein the first clock signal and the third clock signal are opposite.

15. The image display system as claimed in claim 12, wherein the first capacitance and the second capacitance have the same capacitance value.

16. The image display system as claimed in claim 12, wherein the third switch, the fifth switch, the eighth switch and the ninth switch are PMOS transistors and the fourth switch, the sixth switch, the seventh switch and the tenth switch are NMOS transistors.

17. The image display system as claimed in claim 1, further comprising a display panel, wherein the D/A converter forms a portion of the display panel.

18. The image display system as claimed in claim 1, further comprising an electronic device, wherein the electronic device comprises:
- the display panel; and
- a power supply coupled to and providing power to the display panel.

19. A digital to analog converting method, comprising:
- sharing and storing charges in a first capacitance and a second capacitance by sequence according to a reference voltage, a ground voltage, a first clock and first to (N−1)th bits of serial digital signals;
- deciding whether to boost a first terminal and a second terminal of the second capacitance to the reference voltage according to a second clock signal and the Nth bit of the serial digital signal; and
- outputting an analog signal from the second terminal of the second capacitance after a voltage boosting circuit receives the Nth bit of the serial digital signal.

20. The digital to analog converting method as claimed in claim 19, further comprising discharging the charges of the first capacitance and the second capacitance of the charge sharing circuit according to a reset signal.

\* \* \* \* \*